(12) United States Patent
Choi

(10) Patent No.: US 9,721,675 B1
(45) Date of Patent: Aug. 1, 2017

(54) MEMORY DEVICE HAVING INPUT CIRCUIT AND OPERATING METHOD OF SAME

(71) Applicant: WINBOND ELECTRONICS CORPORATION, Taichung (TW)

(72) Inventor: Myung Chan Choi, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 0 days.

(21) Appl. No.: 15/346,807

(22) Filed: Nov. 9, 2016

(51) Int. Cl.
  *G11C 7/10* (2006.01)
  *G11C 29/02* (2006.01)
  *G11C 7/22* (2006.01)

(52) U.S. Cl.
  CPC .......... *G11C 29/023* (2013.01); *G11C 7/1006* (2013.01); *G11C 7/1051* (2013.01); *G11C 7/22* (2013.01); *G11C 29/02* (2013.01); *G11C 29/028* (2013.01)

(58) Field of Classification Search
  CPC ....... G11C 29/023; G11C 7/22; G11C 29/028; G11C 7/1006; G11C 29/02; G11C 7/1051
  See application file for complete search history.

(56) References Cited

U.S. PATENT DOCUMENTS

| | | | | |
|---|---|---|---|---|
| 5,915,105 A | * | 6/1999 | Farmwald | G06F 11/006 365/189.02 |
| 6,804,165 B2 | * | 10/2004 | Schrogmeier | G11C 7/1072 365/189.07 |

* cited by examiner

*Primary Examiner* — Gene Auduong
(74) *Attorney, Agent, or Firm* — Finnegan, Henderson, Farabow, Garrett & Dunner LLP

(57) ABSTRACT

An input circuit of a memory device includes an input receiver to receive an input signal, a clock receiver to receive a clock signal, a data latch, an input signal delay path coupled to the input receiver and configured to provide a delayed internal input signal to the data latch, a first clock signal delay path coupled to the clock receiver and configured to provide a first delayed internal clock signal, a second clock signal delay path coupled to the input receiver and configured to provide a second delayed internal clock signal, and a multiplexer coupled to receive and select one of the first delayed internal clock signal and the second delayed internal clock signal in response to a test mode control signal, and to provide the selected signal to the data latch.

15 Claims, 9 Drawing Sheets

MEMORY DEVICE HAVING INPUT CIRCUIT AND OPERATING METHOD OF SAME

FIELD OF THE DISCLOSURE

The present disclosure relates to a memory device including an input circuit, and a method of operating the memory device.

BACKGROUND

Memory devices are included in computers or other electronic devices for storing data. Typically, data to be stored in a memory device is buffered in an input circuit of the memory device. In order for the input circuit to properly capture the data, signals in the input circuit must satisfy an input setup and hold time requirement. However, as data transmission speeds become faster, it becomes more difficult to satisfy the input setup and hold time requirement.

SUMMARY

According to an embodiment of the disclosure, an input circuit of a memory device includes an input receiver to receive an input signal, a clock receiver to receive a clock signal, a data latch, an input signal delay path coupled to the input receiver and configured to provide a delayed internal input signal to the data latch, a first clock signal delay path coupled to the clock receiver and configured to provide a first delayed internal clock signal, a second clock signal delay path coupled to the input receiver and configured to provide a second delayed internal clock signal, and a multiplexer coupled to receive and select one of the first delayed internal clock signal and the second delayed internal clock signal in response to a test mode control signal, and to provide the selected signal to the data latch.

According to another embodiment of the disclosure, a memory system includes a test controller and a memory device coupled to the test controller during a test operation. The memory device includes an input circuit, a test mode generator, and a memory cell array. The input circuit includes an input receiver to receive an input signal from the test controller, a clock receiver to receive a clock signal from the test controller, a data latch, an input signal delay path coupled to the input receiver and configured to introduce an input delay time and a trimming time to the input signal to provide a delayed internal input signal to the data latch, a first clock signal delay path coupled to the clock receiver and configured to introduce a clock delay time to the clock signal to provide a first delayed internal clock signal, a second clock signal delay path coupled to the input receiver and configured to introduce the clock delay time and an evaluation time to the input signal to provide a second delayed internal clock signal, and a multiplexer coupled to receive and select one of the first delayed internal clock signal and the second delayed internal clock signal in response to a test mode control signal generated by the test mode generator, to provide to the data latch.

According to still another embodiment of the disclosure, a method for operating a memory device is provided. The memory device includes an input circuit and a memory cell array. The input circuit includes an input receiver to receive an input signal, a clock receiver to receive a clock signal, a data latch, an input signal delay path coupled to the input receiver and configured to introduce an input delay time and a trimming time to the input signal to provide a delayed internal input signal to the data latch, a first clock signal delay path coupled to the clock receiver and configured to introduce a clock delay time to the clock signal to provide a first delayed internal clock signal, a second clock signal delay path coupled to the input receiver and configured to introduce the clock delay time and an evaluation time to the input signal to provide a second delayed internal clock signal, and a multiplexer coupled to receive and select one of the first delayed internal clock signal and the second delayed internal clock signal in response to a test mode control signal, to provide to the data latch. The method includes enabling a test mode to control the multiplexer to select the second delayed internal clock signal.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
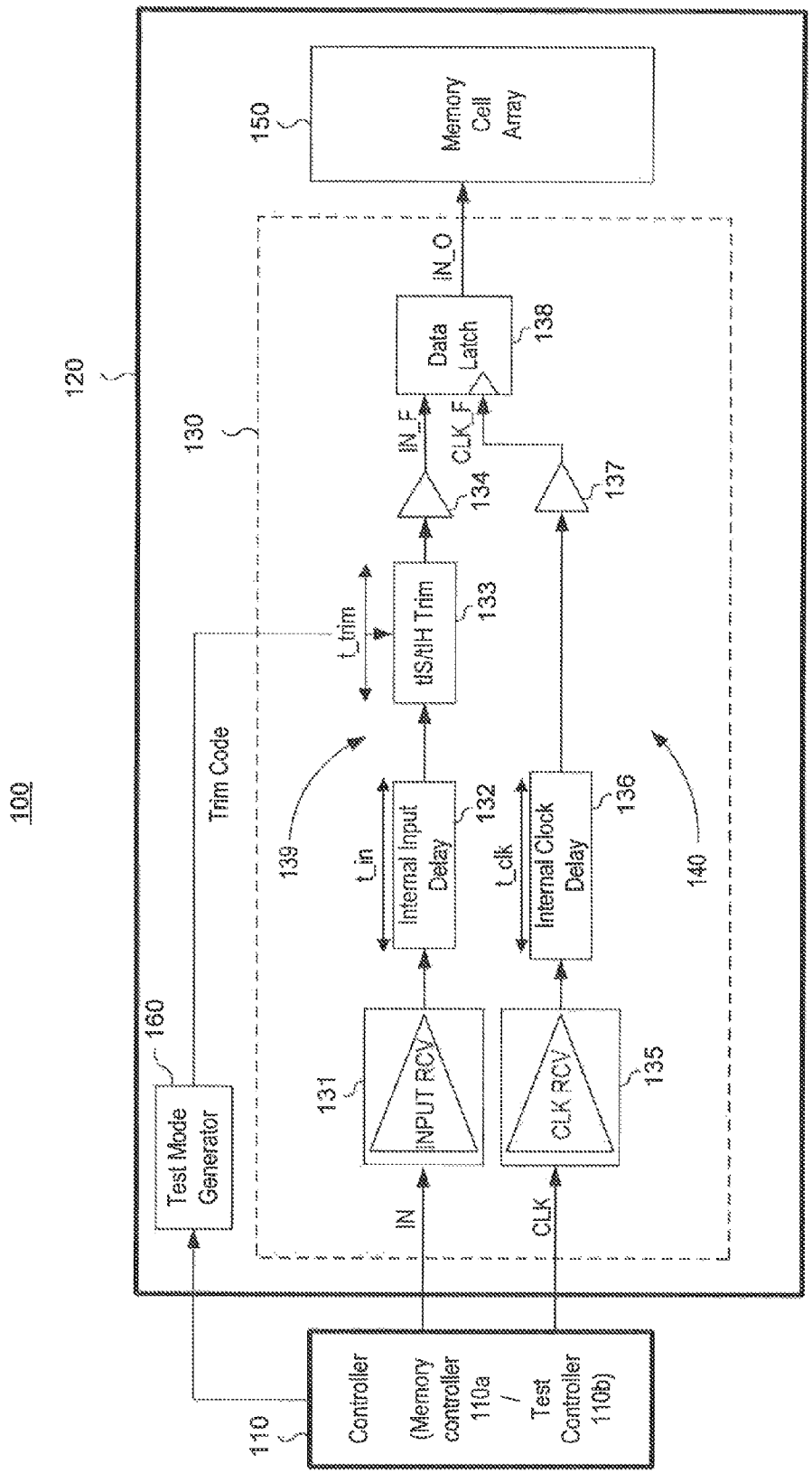
FIG. 1 illustrates a memory system including a memory device.

FIG. 1 illustrates a memory system 100. Memory system 100 includes a controller 110 and a memory device 120 coupled to controller 110. Memory device 120 includes an input circuit 130, a memory cell array 150, and a test mode generator 160. Input circuit 130 includes an input receiver 131 (denoted as "INPUT RCV" in FIG. 1), an internal input delay circuit 132, a trimming circuit 133 (denoted as "tIS/tIH trim" in FIG. 1), an input driver 134, a clock receiver 135 (denoted as "CLK RCV" in FIG. 1), an internal clock delay circuit 136, a clock driver 137, and a data latch 138 (denoted as "F/F" in FIG. 1) coupled to receive the outputs of input driver 134 and clock driver 137.

Controller 110 can be a memory controller 110a that is coupled to memory device 120 during normal operation of memory device 120. Alternatively, controller 110 can be a test controller 110b that is coupled to memory device 120 during test operation of memory device 120. During the normal operation, memory controller 110a outputs an input signal IN and a clock signal CLK to memory device 120, to instruct memory device 120 to perform normal memory operations such as program operations, read operations, and erase operations. During the test operation, test controller 110b outputs the input signal IN and the clock signal CLK to input circuit 130 of memory device 120, and outputs control signals to test mode generator 160 of memory device 120. In response to the control signals, test mode generator 160 outputs a trim code to input circuit 130 of memory device 120, to determine and program a t_trim value. The test operation will be explained in more detail below. In the following description, unless otherwise specified, the term "controller 110" represents either one of memory controller 110a and test controller 110b.

In memory device 120, input circuit 130 is coupled to receive the input signal IN and the clock signal CLK from controller 110 and is configured to transfer input data carried by the input signal IN to memory cell array 150.

In input circuit 130, input receiver 131 is coupled to controller 110 to receive the input signal IN and is configured to adjust a voltage level of the input signal IN to be appropriate for operation of memory cell array 150. Internal input delay circuit 132 is coupled to input receiver 131 and is configured to introduce an input delay time t_in to the input signal IN having the adjusted voltage level. Trimming circuit 133 is coupled to internal input delay circuit 132 and is configured to introduce a trimming time t_trim to the input signal IN. During the test operation, trimming circuit 133 is also coupled to test mode generator 160, which is coupled to test controller 110b, to receive the trim code to configure the trimming time t_trim. Internal input delay circuit 132 and trimming circuit 133 constitute an input signal delay path 139 that provides a delayed internal input signal IN_F. A total delay time of the internal input signal IN_F with respect to the input signal IN is t_in +t_trim. Input driver 134 is coupled to trimming circuit 133 and is configured to drive the delayed internal input signal IN_F to data latch 138.

In addition, in input circuit 130, clock receiver 135 is coupled to controller 110 to receive the clock signal CLK and is configured to adjust a voltage level of the clock signal CLK to be appropriate for operation of memory cell array 150. Internal clock delay circuit 136 is coupled to clock receiver 135 and is configured to introduce a clock delay time t_clk to the clock signal CLK having the adjusted voltage level. Internal clock delay circuit 136 constitutes a clock signal delay path 140 that provides a delayed internal clock signal CLK_F. A total delay time of the internal clock signal CLK_F with respect to the clock signal CLK is t_clk. Clock driver 137 is coupled to internal clock delay circuit 136 and is configured to drive the delayed internal clock signal CLK to data latch 138.

Data latch 138 is coupled to input driver 134 and clock driver 137 to receive the delayed internal input signal IN_F and the delayed internal clock signal CLK_F. Logic levels (i.e., "0" or "1") carried by the delayed internal input signal IN_F are captured (i.e., stored or held) by data latch 138 when an active edge (i.e., rising or falling) of the delayed internal clock signal CLK_F arrives at data latch 138. Data latch 138 is configured to store the logic levels and output a signal IN_O representing the stored logic levels.

Figure 2:
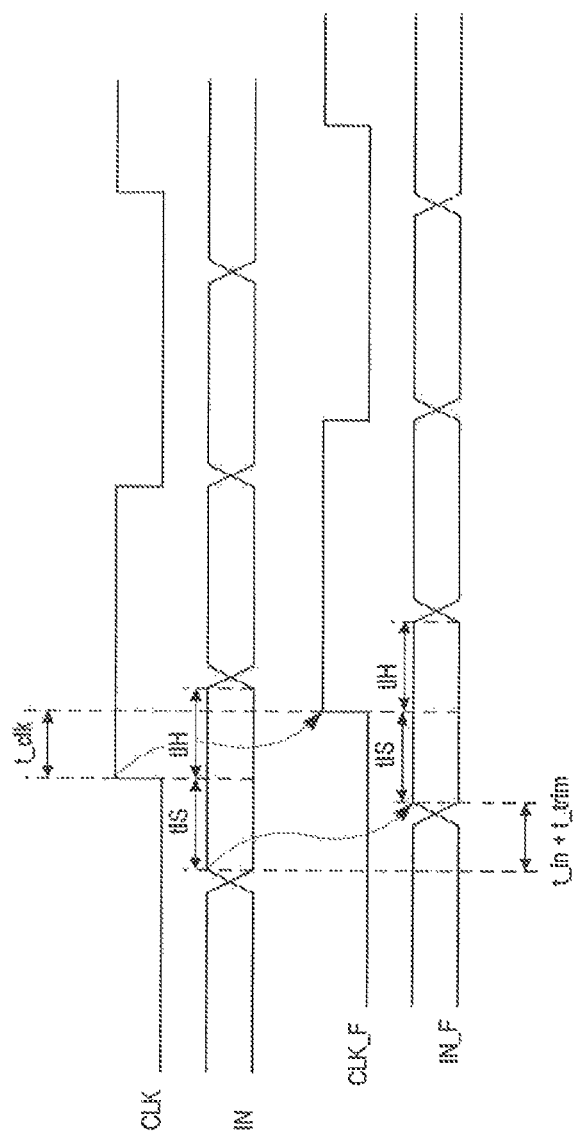
FIG. 2 illustrates a timing diagram of various signals during a normal operation of the memory device of FIG. 1.

FIG. 2 illustrates a timing diagram of the input signal IN, the clock signal CLK, the internal input signal IN_F, and the delayed internal clock signal CLK_F during normal operation of memory device 120. As described previously, during the normal operation, memory controller 110a outputs the input signal IN and the clock signal CLK to memory device 120. The input signal IN and the clock signal CLK from memory controller 110a comply with an input setup and hold time requirement. According to the requirement, the input signal IN must be stable for at least a specific period of time (i.e., a setup time tIS), immediately prior to the arrival of an active edge (e.g., rising edge as illustrated in FIG. 2) of the clock signal CLK. In addition, according to the requirement, the input signal IN must continue to be stable for at least a specific period of time (i.e., a hold time tIH), immediately after the arrival of the active edge of the clock signal CLK. The setup time tIS and hold time tIH are predetermined according to a specific application of memory device 120. For example, in some applications, both of the setup time tIS and the hold time tIH are required to be 200 picoseconds (ps).

The internal input signal IN_F and the internal clock signal CLK_F are also required to comply with the input setup and hold requirement. That is, the internal input signal IN_F must be stable for at least the setup time tIS immediately prior to the arrival of the active edge of the internal clock signal CLK_F, and the internal input signal IN_F must continue to be stable for at least the hold time tIH immediately after the arrival of the active edge of the internal clock signal CLK_F. In order for the internal input signal IN_F and the internal clock signal CLK_F to comply with the input setup and hold requirement, the total delay time, i.e., t_in +t_trim, of the internal input signal IN_F with respect to the input signal IN, is required to be equal to the total delay time, i.e., t_clk, of the internal clock signal CLK_F with respect to the clock signal CLK. That is, t_in+t_trim=t_clk.

Typically, when memory device 120 is manufactured, the input delay time t_in provided by internal input delay circuit 132 and the clock delay time t_clk provided by internal clock delay circuit 136 are different from each other due to manufacturing variability. To compensate the difference between the input delay time t_in and the clock delay time t_clk, the trimming time t_trim can be determined and programmed into trimming circuit 133 by the test operation, such that t_in +t_trim=t_clk.

Figure 3:
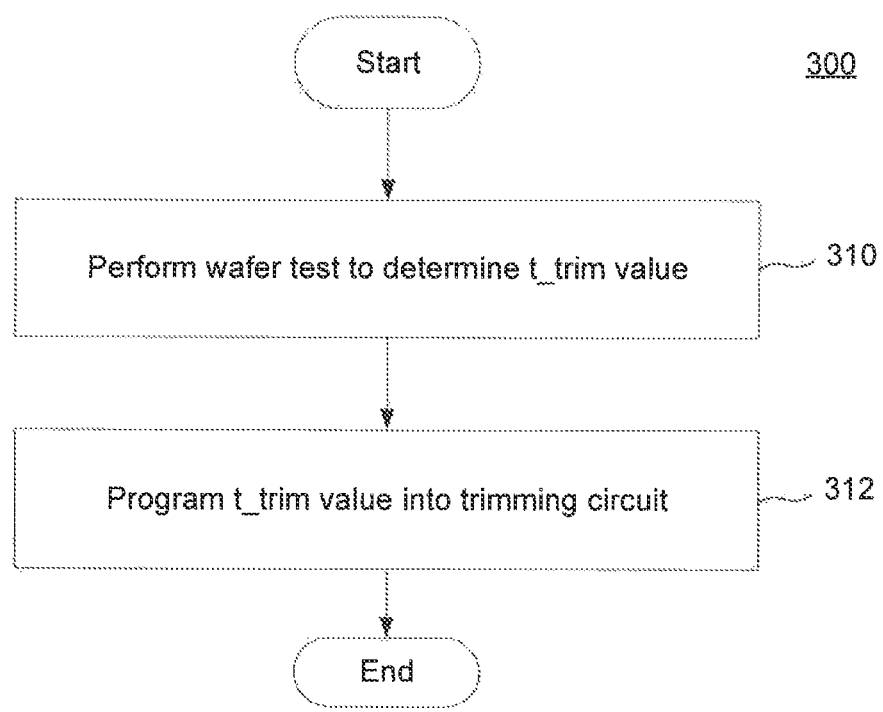
FIG. 3 illustrates a flow chart of a process of a test operation of the memory device of FIG. 1.

FIG. 3 illustrates a flow chart of a process 300 of a test operation of memory device 120. Process 300 is performed by test controller 110b connected to memory device 120.

According to FIG. 3, test controller 110b first determines an appropriate t_trim value for memory device 120 (step 310). In order to determine the appropriate t_trim value, test controller 110b conducts a performance test on memory device 120 for each one of a plurality of t_trim values, and records the test result (i.e., whether memory device 120 passes or fails the performance test). For each performance test, a corresponding t_trim value is temporarily programmed into trimming circuit 133 by test mode generator 160 outputting a trim code corresponding to the t_trim value to trimming circuit 133. During the performance test, test controller 110b outputs an input signal IN and a clock signal CLK to memory device 120 to perform one or more memory operations (e.g., program operation, read operation, erase operation, etc.) If the one or more memory operations have been performed successfully, test controller 110b determines that memory device 120 passes the performance test; otherwise, test controller 110b determines that memory device 120 fails the performance test. After conducting the performance tests on memory device 120, test controller 110b determines the appropriate t_trim value based on the test results.

After determining the appropriate t_trim value for memory device 120, test controller 110b permanently programs the appropriate t_trim value into trimming circuit 133 of memory device 120 by burning one or more fuses in trimming circuit 133 (step 320).

Figure 4:
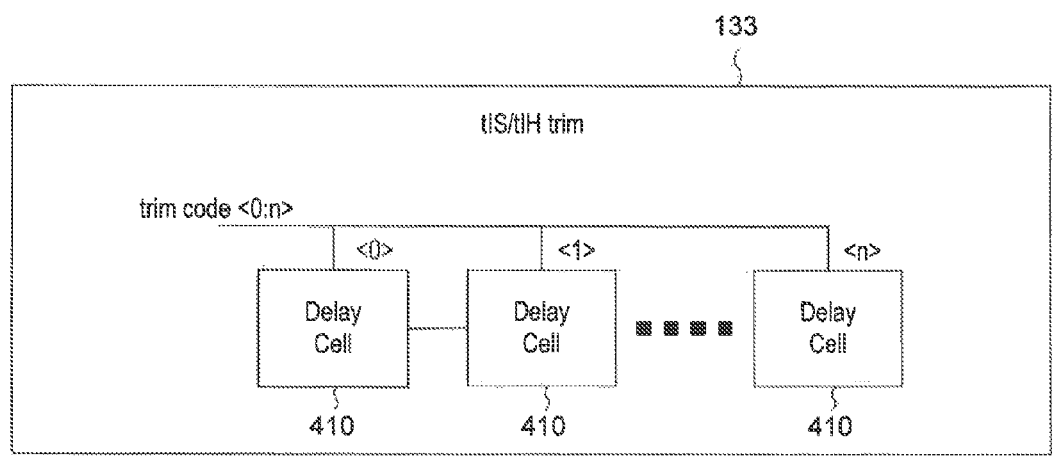
FIG. 4 illustrates a structure of a trimming circuit in the memory device of FIG. 1.

FIG. 4 illustrates a structure of trimming circuit 133. As illustrated in FIG. 4, trimming circuit 133 includes n+1 delay cells 410, where n is an integer greater than or equal to 1. Each delay cell 410 provides a unit delay time t_unit. During the test operation, trimming circuit 133 receives a trim code from test mode generator 160. The trim code can be any one from 0 to n. The delay cells 410 are enabled by the trim code received from test mode generator 160. For example, when the trim code is 0, one delay cell 410 is enabled, and thus the trimming time t_trim provided by trimming circuit 400 is the unit delay time t_unit, i.e., t_trim=t_unit; when the trim code is 1, two delay cells 410 are enabled, and thus t_trim=2×t_unit; when the trim code is 2, three delay cells 410 are enabled, and thus t_trim=3× t_unit; and so on.

The test operation of memory device 120 is performed at a package level by a package level test controller, i.e., after memory device 120 is manufactured in a wafer, cut from the wafer, and packaged. The package level test controller is capable of performing high frequency tests. Thus, the trimming time determined from the package level test operation is usually accurate.

In some applications, it is more desirable to perform the test operation at a wafer level, i.e., after memory device 120 is manufactured in a wafer but before memory device 120 is cut from the wafer and packaged. During the wafer level test operation, a wafer level test controller outputs input signal IN and clock signal CLK to memory device 120 by applying test probe terminals to contacts in the wafer. In this case, variations might exist in the arrival times of the input signal IN and the clock signal CLK. These variations might transfer to the internal input signal IN_F and the internal clock signal CLK_F. As a result, the trimming time determined by the wafer level test operation might not be accurate.

In order to avoid the problems associated with the wafer level test operation, in the embodiments of the present disclosure, both of the internal input signal IN_F and the internal clock signal CLK_F are generated from the input signal IN during the test operation, such that variations in the input signal IN and the clock signal CLK no longer affect the internal input signal IN_F and the internal clock signal CLK_F.

Figure 5:
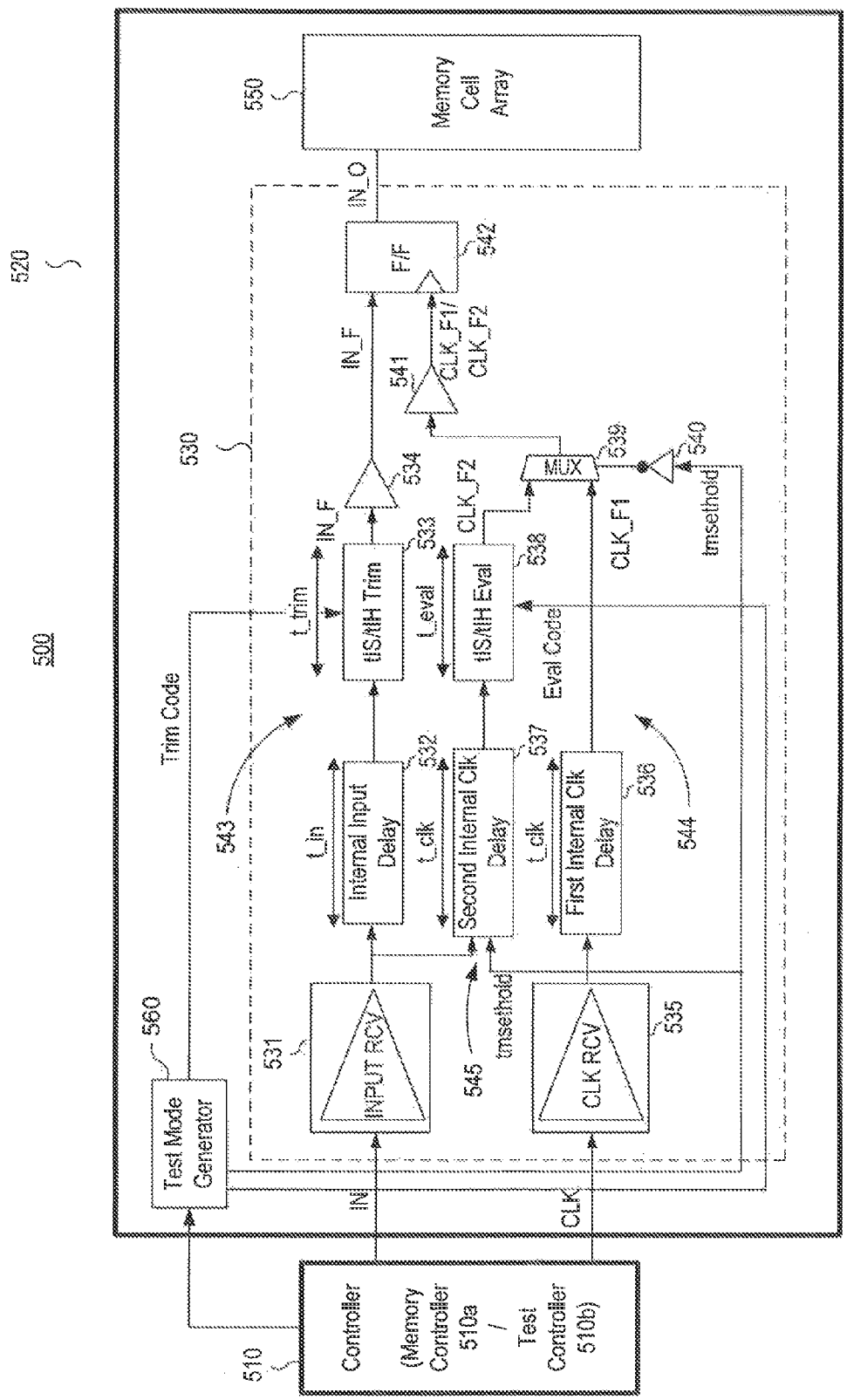
FIG. 5 illustrates a memory system including a memory device, according to an illustrated embodiment.

FIG. 5 illustrates a memory system 500, according to an illustrated embodiment. System 500 includes a controller 510 and a memory device 520 coupled to controller 510. Memory device 520 includes an input circuit 530, a memory cell array 550, and a test mode generator 560. Input circuit 530 includes an input receiver 531 (denoted as "INPUT RCV" in FIG. 5), an internal input delay circuit 532, a trimming circuit 533 (denoted as "tIS/tIH Trim" in FIG. 5), an input driver 534, a clock receiver 535 (denoted as "CLK RCV" in FIG. 5), a first internal clock delay circuit 536, a second internal clock delay circuit 537, an evaluation circuit 538 (denoted as "tIS/tIH Eval" in FIG. 5), a multiplexer 539 (denoted as "MUX" in FIG. 5), an inverter 540, a clock driver 541, and a data latch 542 (denoted as "FIF" in FIG. 1).

Controller 510 can be a memory controller 510a that is coupled to memory device 520 during normal operation of memory device 520. Alternatively, controller 510 can be a test controller 510b that is coupled to memory device 520 during test operation of memory device 520. During the normal operation, memory controller 510a outputs an input signal IN and a clock signal CLK to memory device 520. During the test operation, test controller 510b outputs the input signal IN and the clock signal CLK to input circuit 530 of memory device 520, and outputs control signals to test mode generator 560 of memory device 520. In response to the control signals, test mode generator 560 outputs a trim code, an evaluation code, and a test control signal "tmsethold" to input circuit 530 of memory device 520. In the following description, unless otherwise specified, the term "controller 510" represents either one of memory controller 510a and test controller 510b.

In memory device 520, input circuit 530 is coupled to receive the input signal IN and the clock signal CLK from controller 510 and is configured to transfer data carried by the input signal IN to memory cell array 550.

In input circuit 530, input receiver 531 is coupled to controller 510 to receive the input signal IN and is configured to adjust a voltage level of the input signal IN to be appropriate for operation of memory cell array 550. Internal input delay circuit 532 is coupled to input receiver 531 to receive the input signal IN having the adjusted voltage level, and is configured to introduce an input delay time t_in to the input signal IN. Trimming circuit 533 is coupled to internal input delay circuit 532 and is configured to introduce a trimming time t_trim to the input signal IN. During the test operation, trimming circuit 533 is also coupled to test mode generator 560 which is coupled to test controller 510b, to receive the trim code to configure the trimming time t_trim. Trimming circuit 533 has substantially the same structure as trimming circuit 133. Therefore, detailed description regarding trimming circuit 533 is not provided. Internal input delay circuit 532 and trimming circuit 533 constitute an input signal delay path 543 that provides a delayed internal input signal IN_F. A total delay time of the delayed internal input signal IN_F with respect to the input signal IN is t_in +t_trim. Input driver 534 is coupled to trimming circuit 533 and is configured to drive the delayed internal input signal IN_F to data latch 542.

In addition, in input circuit 530, clock receiver 535 is coupled to controller 510 to receive the clock signal CLK and is configured to adjust a voltage level of the clock signal CLK to be appropriate for operation of memory cell array 550. First internal clock delay circuit 536 is coupled to clock receiver 535 to receive the clock signal CLK having the adjusted voltage level, and is configured to introduce a clock delay time t_clk to the clock signal CLK. First internal clock delay circuit 536 constitutes a first clock signal delay path 544 that provides a first delayed internal clock signal CLK_F1. A total delay time of the first delayed internal clock signal CLK_F1 with respect to the clock signal CLK is t_clk.

Second internal clock delay circuit 537 is coupled to input receiver 531 to receive the input signal IN and is enabled by the test mode control signal "tmsethold" received from test mode generator 560 during the test operation. Second internal clock delay circuit 537 is formed as a replica of first internal clock delay circuit 536, including exactly the same components and interconnections as the first internal clock delay circuit 536. Thus, like first internal clock delay circuit 536, second internal clock delay circuit 537 also introduces the clock delay time t_clk to the input signal IN. Evaluation circuit 538 is coupled to second internal clock delay circuit 537 and is configured to introduce an evaluation time t_eval to the input signal IN and transform the input signal IN into a clock signal. During the test operation, evaluation circuit 538 is also coupled to test mode generator 560 to receive the evaluation code to configure the evaluation time t_eval. Second internal clock delay circuit 537 and evaluation circuit 538 together constitute a second clock signal delay path 545 that, during the test operation, provides a second delayed internal clock signal CLK_F2. A total delay time of the second delayed clock signal CLK_F2 with respect to the input signal IN is t_clk+t_eval.

Multiplexer 539 is coupled to first internal clock delay circuit 536 to receive the first delayed internal clock signal CLK_F1, and is coupled to evaluation circuit 538 to receive the second delayed internal clock signal CLK_F2. Multiplexer 539 is also coupled to inverter 540. Inverter 540 is coupled to test mode generator 560 to receive the test mode control signal "tmsetshold" and outputs an inversion of the test mode control signal "tmsetshold" to multiplexer 539. Multiplexer 539 is configured to select one of the first delayed internal clock signal CLK_F1 and the second delayed internal clock signal CLK_F2 in response to the test mode control signal "tmsetshold" received from test mode generator 560 via inverter 540.

Clock driver 541 is coupled to multiplexer 539 and is configured to drive the selected one of first delayed internal clock signal CLK_F1 and the second delayed internal clock signal CLK_F2 to data latch 542. In particular, during the normal operation, multiplexer 539 selects the first delayed internal clock signal CLK_F1, and clock driver 541 drives the first delayed internal clock signal CLK_F1 to data latch 542. During the test operation, multiplexer 539 selects the second delayed internal clock signal CLK_F2, and the clock driver 541 drives the second delayed internal clock signal CLK_F2 to data latch 542.

Data latch 542 is coupled to input driver 534 and clock driver 541 to receive the delayed internal input signal IN_F and the selected one of the first delayed internal clock signal CLK_F1 and the second delayed internal clock signal CLK_F2. The logic levels (i.e., "0" or "1") carried by the delayed internal input signal IN_F is captured (i.e., stored or held) by data latch 542 when an active edge (i.e., rising or falling) of the selected one of the first delayed internal clock signal CLK_F1 and the second delayed internal clock signal CLK_F2 arrives at data latch 542. Data latch 542 is configured to store the logic levels and output a signal IN_O representing the stored logic levels.

Memory device 520 is configured to operate in normal operation and in test operation. During the normal operation, memory device 520 is coupled to memory controller 510a which issues an input signal IN and a clock signal CLK to memory device 520. Input data carried by the input signal IN is saved in memory cell array 550 of memory device 520. During the test operation, memory device 520 is coupled to test controller 510b which issues an input signal IN, a clock signal CLK, and control signals for test mode generator 560. The test operation is used to determine an appropriate t_trim value for trimming circuit 533.

Figure 6:
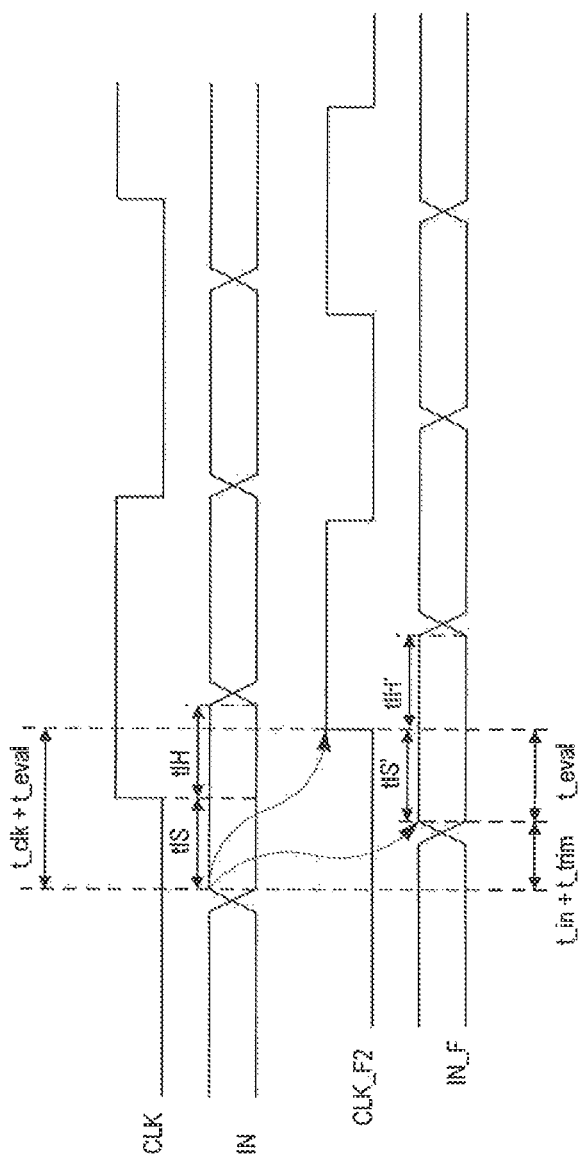
FIG. 6 illustrates a timing diagram of various signals during a test operation of the memory device of FIG. 5, according to an illustrated embodiment.

FIG. 6 illustrates a timing diagram of the input signal IN, the clock signal CLK, the internal input signal IN_F, and the second delayed internal clock signal CLK_F2 during a test operation of memory device 520, according to an illustrated embodiment. As described previously, during the test operation, memory controller 510a outputs the input signal IN and the clock signal CLK to memory device 520. Both of the delayed internal input signal IN_F and the second delayed internal clock signal CLK_F2 are generated from the input signal IN. The total delay time of the delayed internal input signal IN_F with respect to the input signal IN is t_in +t_trim. The total delay time of the second delayed clock signal CLK_F2 with respect to the input signal IN is, t_clk+t_eval.

Figure 7:
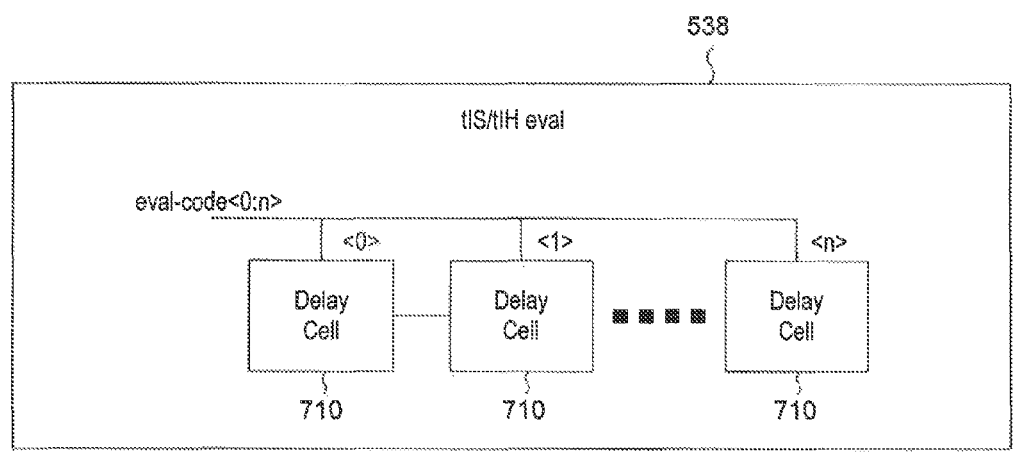
FIG. 7 illustrates a structure of an evaluation circuit in the memory device of FIG. 5, according to an embodiment of the disclosure.

FIG. 7 illustrates a structure of evaluation circuit 538, according to an embodiment of the disclosure. As illustrated in FIG. 7, evaluation circuit 538 includes n+1 delay cells 710, where n is an integer greater than or equal to 1. Each delay cell 710 provides a unit delay time t_unit. During the test operation, evaluation circuit 538 receives an evaluation code (denoted as "eval code") from test mode generator 560. The evaluation code can be any one from 0 to n. The delay cells 710 are enabled by the evaluation code received from test mode generator 560. For example, when the evaluation code is 0, one delay cell 710 is enabled, and thus the evaluation time t_eval provided by evaluation circuit 538 is the unit delay time t_unit, i.e., t_eval=t_unit; when the evaluation code is 1, two delay cells 710 are enabled, and thus t_eval=2× t_unit; when the evaluation code is 2, three delay cells 710 are enabled, and thus t_eval=3× t_unit; and so on.

Figure 8:
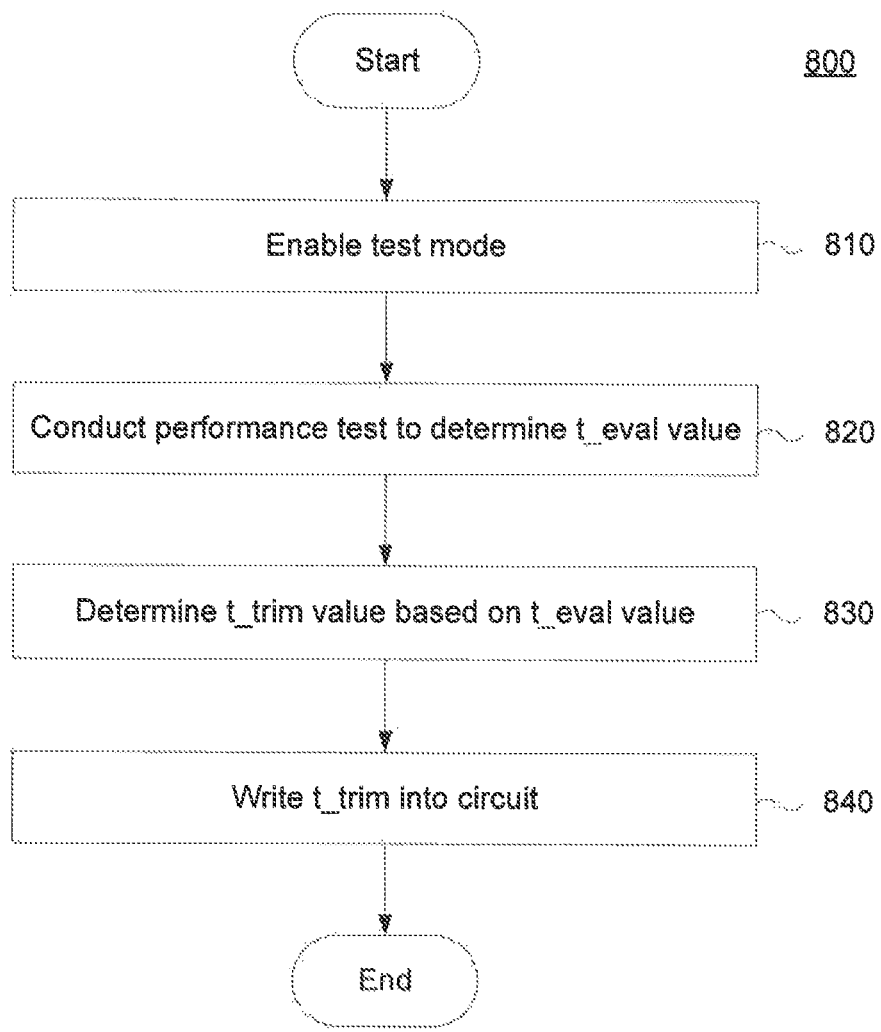
FIG. 8 illustrates a flow chart of a process of a wafer level test operation of the memory device of FIG. 5, according to an embodiment of the disclosure.

FIG. 8 illustrates a flow chart of a process 800 of a wafer level test operation of memory device 520, according to an embodiment of the disclosure. Process 800 is performed by test controller 510b connected to a wafer including a plurality of memory devices having the same circuit as memory device 520 illustrated in FIG. 5. In the following description, memory device 520 is used as an example. However, it should be understood that the test operation of all of the memory devices in the wafer is substantially the same.

Before the wafer level test operation, trimming circuit 533 of memory device 520 is configured to introduce a default t_trim' value for the trimming time. The default t_trim' value was designed to satisfy the relationship t_in +t_trim'=t_clk. For example, the default t_trim' value can be determined by computer simulation using empirical data of the wafer.

According to FIG. 8, in the wafer level test operation, test controller 510b enables a test mode of memory device 520 by controlling the test mode control signal "tmsethold" output to memory device 520 (step 810). For example, test controller 510 controls the test mode control signal to transition from a low voltage level to a high voltage level to enable the test mode. In response to the test mode control signal, second internal clock delay circuit 537 of memory device 520 is enabled to receive the input signal IN from input receiver 531, and introduces the clock delay time t_clk to the input signal IN. In addition, multiplexer 539 of memory device 520 selects the delayed internal clock signal CLK_F2 output from the evaluation circuit 538.

Then, test controller 510b conducts a performance test on memory device 520 to determine an appropriate t_eval value for memory device 520 (step 820). In order to determine the appropriate t_eval value, test controller 510b increases the t_eval value from 0 in a step-wise manner and conducts the performance test at each step, and records the test result (i.e., whether memory device 520 passes or fails the performance test) for each t_eval value. Test controller 510 conducts the same performance test on each one of the other memory devices on the wafer on which memory device 520 is formed. Test controller 510 then determines an appropriate t_eval value for a majority of the memory devices when the majority of the memory devices pass the performance test. The majority of the memory devices can be a predetermined percentage (e.g., 70%, 80%, or 90%, etc.) of all memory devices in the wafer. Test controller 510b also determines an appropriate t_eval value for each one of the remaining memory devices, with the appropriate t_eval value being the value at which the memory device starts to pass the performance test.

Next, test controller 510 determines an appropriate t_trim value for memory device 520 based on the t_eval value determined for memory device 520 (step 830). If memory device 520 is one of the majority of memory devices that pass the performance test at a certain t_eval value, then test controller 510 determines that the appropriate t_trim value for memory device 520 is the default t_trim' value that was initially configured in trimming circuit 533. If memory device 520 is one of the remaining memory devices, then test controller 510 obtains the appropriate t_trim value by adjusting the default t_trim' value of memory device 520 based on a comparison between the t_eval value of memory device 520 and the t_eval value of the majority of the memory devices. When a difference between the t_eval value of the majority of the memory devices and the t_eval value of memory device 520 is Δt_eval, then test controller 510 determines that the default t_trim' value of memory device 520 should be reduced or increased by Δt_eval. That is, the appropriate t_trim value of memory device 520 is t_trim=t_trim'±Δt_eval.

Then, test controller 510*b* permanently programs the determined t_trim value into trimming circuit 533 of memory device 520 by burning fuses in trimming circuit 533 (step 840). For each one of the majority of the memory devices, test controller 510 programs the default t_trim value into trimming circuit 533. For each one of the majority of the devices, test controller 510 programs the adjusted t_trim value into trimming circuit 533. After step 840, process 800 finishes. Then, test controller 510*b* can control the test mode control signal tmsethold to disable the test mode. For example, test controller 510*b* controls the test mode generator 560 to change the test mode control signal tmsethold from the high voltage level to the low voltage level.

Figure 9:
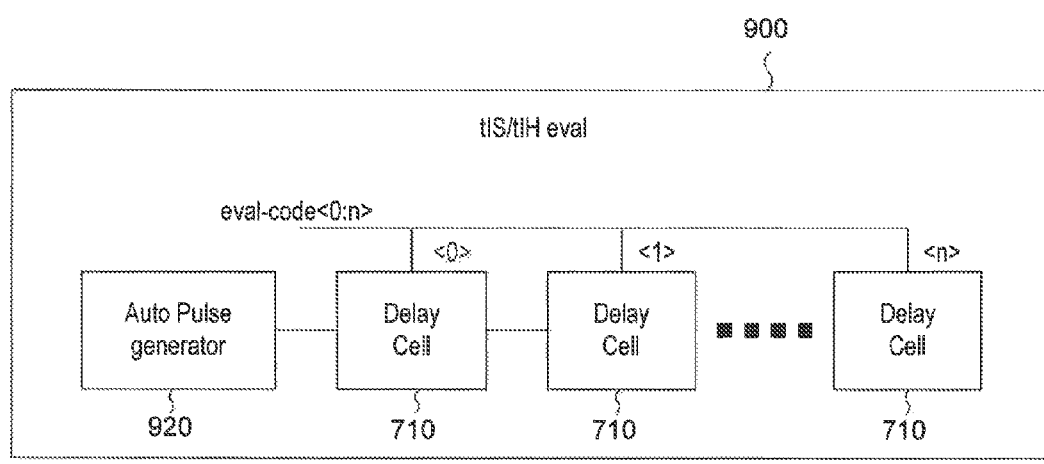
FIG. 9 illustrates a structure of an evaluation circuit in the memory device of FIG. 5, according to another embodiment of the disclosure.

FIG. 9 illustrates a structure of an evaluation circuit 900, according to another embodiment of the disclosure. As illustrated in FIG. 9, evaluation circuit 900 is substantially the same as evaluation circuit 538, except that evaluation circuit 900 includes an auto pulse generator 920 in addition to the n+1 delay cells 710. Auto pulse generator 920 generates a pulse for the second delayed internal clock signal CLK_F2. Since the second delayed internal clock signal CLK_F2 is generated from the input signal IN, without the auto pulse generator 920, the frequency of the second delayed internal clock signal CLK_F2 is the same as the input signal IN, instead of the clock signal CLK. By using the auto pulse generator 920, the frequency of the second delayed internal clock signal CLK_F2 can be configured by the auto pulse generator 920, regardless of the frequency of the input signal IN.

According to the above described embodiments, the trimming time t_trim is determined during a test operation of memory device 520, in which both of internal input signal IN_F and internal clock signal CLK_F2 are generated from input signal IN. Therefore, variations in the input signal IN and the clock signal CLK during a wafer test do not affect the internal input signal IN_F and the internal clock signal CLK_F. As a result, the determined trimming time t_trim can be accurate.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An input circuit of a memory device, comprising:
   an input receiver to receive an input signal;
   a clock receiver to receive a clock signal;
   a data latch;
   an input signal delay path coupled to the input receiver and configured to provide a delayed internal input signal to the data latch;
   a first clock signal delay path coupled to the clock receiver and configured to provide a first delayed internal clock signal;
   a second clock signal delay path coupled to the input receiver and configured to provide a second delayed internal clock signal; and
   a multiplexer coupled to receive and select one of the first delayed internal clock signal and the second delayed internal clock signal in response to a test mode control signal, and to provide the selected signal to the data latch.

2. The input circuit of claim 1, wherein the input signal delay path includes:
   an internal input delay circuit configured to introduce an input delay time to the input signal; and
   a trimming circuit configured to introduce a trimming time to the input signal.

3. The input circuit of claim 2, wherein the trimming circuit is coupled to receive a trim code to configured the trimming time.

4. The input circuit of claim 2, wherein the first clock signal delay path includes:
   a first internal clock delay circuit configured to introduce a clock delay time to the clock signal to provide the first delayed internal clock signal.

5. The input circuit of claim 4, wherein the second clock signal delay path includes:
   a second internal clock delay circuit being a replica of the first internal clock delay circuit and configured to introduce the clock delay time to the input signal; and
   an evaluation circuit configured to introduce an evaluation time to the input signal to provide the second delayed internal clock signal.

6. The input circuit of claim 5, wherein the evaluation circuit is coupled to receive an evaluation code to configure the evaluation time.

7. The input circuit of claim 1, wherein the multiplexer is configured to:
   during a test operation, select the second delayed internal clock signal; and
   during a normal operation, select the first delayed internal clock signal.

8. The input circuit of claim 1, further including:
   an inverter coupled to receive the test mode control signal and output an inversion of the test mode control signal to the multiplexer.

9. A memory system, comprising:
   a test controller; and
   a memory device coupled to the test controller during a test operation, the memory device including an input circuit, a test mode generator, and a memory cell array, the input circuit including:
   an input receiver to receive an input signal from the test controller;
   a clock receiver to receive a clock signal from the test controller;
   a data latch;
   an input signal delay path coupled to the input receiver and configured to introduce an input delay time and a trimming time to the input signal to provide a delayed internal input signal to the data latch;

a first clock signal delay path coupled to the clock receiver and configured to introduce a clock delay time to the clock signal to provide a first delayed internal clock signal;

a second clock signal delay path coupled to the input receiver and configured to introduce the clock delay time and an evaluation time to the input signal to provide a second delayed internal clock signal; and a multiplexer coupled to receive and select one of the first delayed internal clock signal and the second delayed internal clock signal in response to a test mode control signal generated by the test mode generator, to provide to the data latch.

10. The memory system of claim 9, wherein the test controller is configured to:

control the test mode generator to generate the test mode control signal to enable a test mode to control the multiplexer to select the second delayed internal clock signal.

11. The memory system of claim 10, wherein the test controller is further configured to:

conduct a performance test on the memory device to determine the evaluation time for the memory device; and determine the trimming time based on the determined evaluation time.

12. The memory device of claim 11, further including a trimming circuit included in the input signal delay path, wherein the test controller is configured to program the determined trimming time into the trimming circuit.

13. A method for operating a memory device, the memory device including an input circuit and a memory cell array, the input circuit including:

an input receiver to receive an input signal;

a clock receiver to receive a clock signal;

a data latch;

an input signal delay path coupled to the input receiver and configured to introduce an input delay time and a trimming time to the input signal to provide a delayed internal input signal to the data latch;

a first clock signal delay path coupled to the clock receiver and configured to introduce a clock delay time to the clock signal to provide a first delayed internal clock signal;

a second clock signal delay path coupled to the input receiver and configured to introduce the clock delay time and an evaluation time to the input signal to provide a second delayed internal clock signal; and a multiplexer coupled to receive and select one of the first delayed internal clock signal and the second delayed internal clock signal in response to a test mode control signal, to provide to the data latch, the method including enabling a test mode to control the multiplexer to select the second delayed internal clock signal.

14. The method of claim 13, further including:

conducting a performance test on the memory device to determine the evaluation time for the memory device.

15. The method of claim 14, further including determining the trimming time based on the determined evaluation time; and programming the determined trimming time into a trimming circuit included in the input signal delay path.

* * * * *